United States Patent
Igarashi

(10) Patent No.: US 12,336,200 B2
(45) Date of Patent: Jun. 17, 2025

(54) METAL-INSULATOR-METAL (MIM) CAPACITOR WITH ADDITIONAL ELECTRODE EMBEDDED IN INSULATING FILM

(71) Applicant: Sumitomo Electric Device Innovations, Inc., Yokohama (JP)

(72) Inventor: Takeshi Igarashi, Yokohama (JP)

(73) Assignee: Sumitomo Electric Device Innovations, Inc., Yokohama (JP)

(*) Notice: Subject to any disclaimer, the term of this patent is extended or adjusted under 35 U.S.C. 154(b) by 433 days.

(21) Appl. No.: 17/690,333

(22) Filed: Mar. 9, 2022

(65) Prior Publication Data
US 2022/0302246 A1    Sep. 22, 2022

(30) Foreign Application Priority Data
Mar. 19, 2021   (JP) .................................. 2021-045496

(51) Int. Cl.
*H10D 1/68*    (2025.01)
*H01G 4/08*    (2006.01)

(52) U.S. Cl.
CPC ............... *H10D 1/692* (2025.01); *H01G 4/08* (2013.01)

(58) Field of Classification Search
CPC ........... H01L 28/60; H01L 28/40; H01G 4/08; H01G 4/33; H10D 1/68; H10D 1/692
See application file for complete search history.

(56) References Cited

U.S. PATENT DOCUMENTS

| | | |
|---|---|---|
| 2002/0130389 A1 | 9/2002 | Arimochi et al. |
| 2013/0194714 A1 | 8/2013 | Nakaiso et al. |
| 2021/0327888 A1* | 10/2021 | Wang ................ H01L 28/55 |
| 2022/0059290 A1* | 2/2022 | Matsubara ........... H01L 28/60 |

FOREIGN PATENT DOCUMENTS

| | | |
|---|---|---|
| JP | 2001-015693 A | 1/2001 |
| WO | 2012/036017 A1 | 3/2012 |

* cited by examiner

*Primary Examiner* — Nelson Garces
(74) *Attorney, Agent, or Firm* — Volpe Koenig

(57) ABSTRACT

A capacitor includes an MIM capacitor that includes a lower electrode, a dielectric film disposed on the lower electrode, and an upper electrode disposed on the dielectric film, an insulating film that is disposed on the upper electrode so as to cover the MIM capacitor, and an additional electrode that is disposed in the insulating film and above an outer periphery of the upper electrode, has an outer periphery located outside the outer periphery of the upper electrode, and is connected to the upper electrode.

9 Claims, 10 Drawing Sheets

METAL-INSULATOR-METAL (MIM) CAPACITOR WITH ADDITIONAL ELECTRODE EMBEDDED IN INSULATING FILM

CROSS REFERENCE TO RELATED APPLICATIONS

This application claims priority based on Japanese Patent Application No. 2021-045496 filed on Mar. 19, 2021, the entire contents of which are incorporated herein by reference.

FIELD

The present disclosure relates to a capacitor, and more particularly to a capacitor having a MIM capacitor.

BACKGROUND

There is known a metal-insulator-metal (MIM) capacitor in which a lower electrode, a dielectric film, and an upper electrode are stacked on a substrate. The MIM capacitor is integrated with an active element such as a transistor provided on or above a semiconductor layer, for example, and is used for a monolithic microwave integrated circuit (MIMIC). Note that the technique related to the present disclosure is disclosed in Japanese Laid-open Patent Publication No. 2001-15693.

SUMMARY

One embodiment of the present disclosure is a capacitor including: an MIM capacitor that includes a lower electrode, a dielectric film disposed on the lower electrode, and an upper electrode disposed on the dielectric film; an insulating film that is disposed on the upper electrode so as to cover the MIM capacitor; and an additional electrode that is disposed in the insulating film and above an outer periphery of the upper electrode, has an outer periphery located outside the outer periphery of the upper electrode, and is connected to the upper electrode.

DETAILED DESCRIPTION OF EMBODIMENTS

However, when the MIM capacitor is subjected to a current-carrying test, the capacitor may be broken near the outer periphery of the upper electrode.

The present disclosure has been made in view of the above problem, and an object of the present disclosure is to suppress breakdown of a capacitor.

Description of Embodiments of the Present Disclosure

First, the contents of embodiments of the present disclosure will be listed and described.

(1) One embodiment of the present disclosure is a capacitor including: an MIM capacitor that includes a lower electrode, a dielectric film disposed on the lower electrode, and an upper electrode disposed on the dielectric film; an insulating film that is disposed on the upper electrode so as to cover the MIM capacitor; and an additional electrode that is disposed in the insulating film and above an outer periphery of the upper electrode, has an outer periphery located outside the outer periphery of the upper electrode, and is connected to the upper electrode. As a result, since the additional electrode shields the electric field, it is possible to suppress breakdown of the capacitor in an energization test or the like.

(2) Along an entirety of the outer periphery of the upper electrode, the outer periphery of the additional electrode may be located outside the outer periphery of the upper electrode.

(3) The outer periphery of the additional electrode may be located outside the outer periphery of the upper electrode by a distance greater than or equal to a distance between a lower surface of the additional electrode and a lower surface of the upper electrode.

(4) An outer periphery of the lower electrode may be located outside the outer periphery of the upper electrode.

(5) A lower surface of the additional electrode may be located above an upper surface of the lower electrode by a distance greater than or equal to twice a thickness of the dielectric film.

(6) The dielectric film may be an inorganic insulator film, and the insulating film may be an organic insulator film.

(7) The additional electrode may be joined to the upper electrode at a central portion thereof.

(8) The additional electrode may have an opening in a region facing an upper surface of the upper electrode across the insulating film.

(9) The MIM capacitor may be disposed on or above a semiconductor layer.

Details of Embodiments of the Present Disclosure

Specific examples of capacitors according to embodiments of the present disclosure will be described below with reference to the drawings. Note that the present disclosure is not limited to these examples, but is indicated by the scope of the claims, and is intended to include all modifications within the meaning and the range equivalent to the scope of the claims.

First Embodiment

Figure 1:
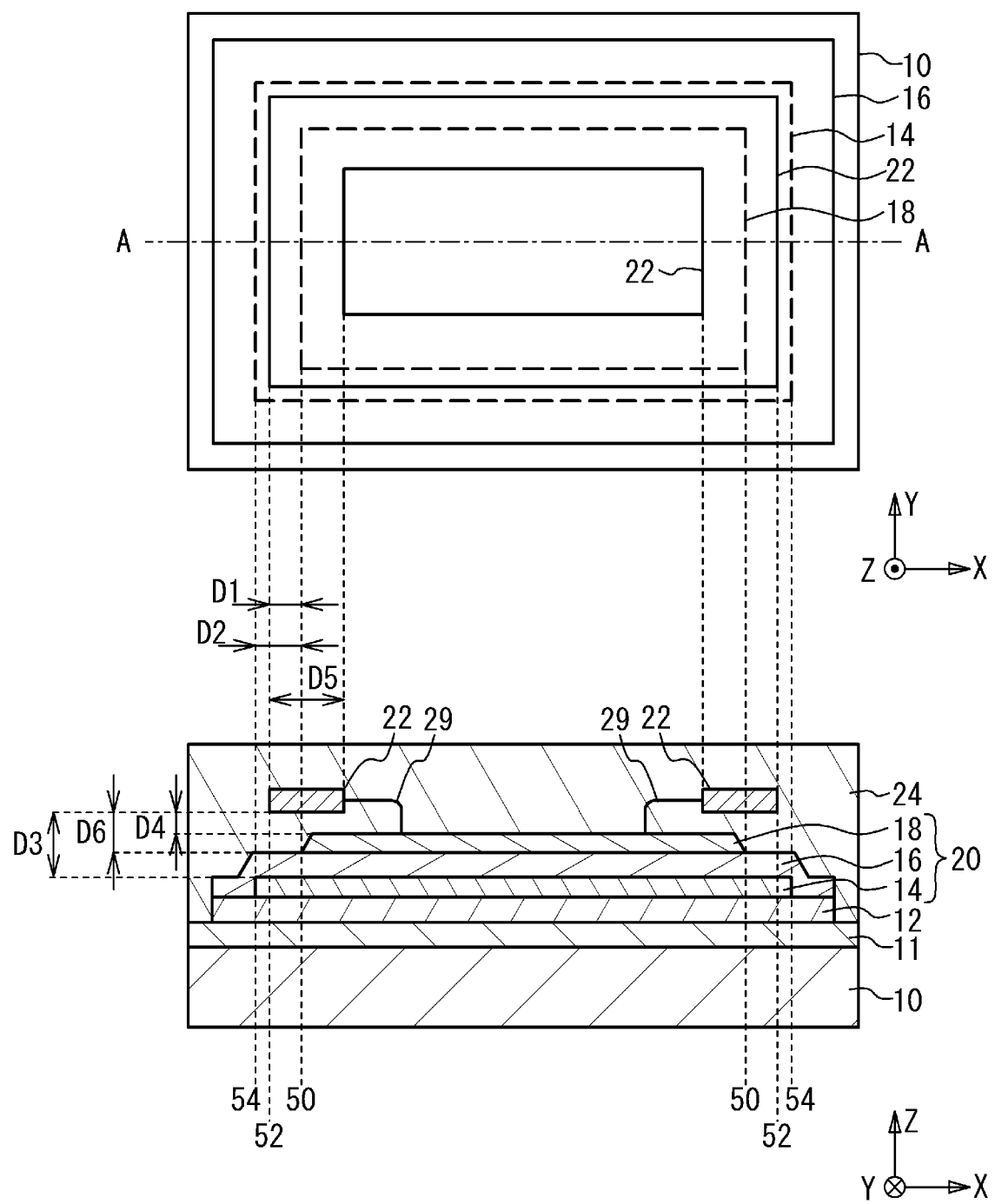
FIG. 1 is a plan view and a cross-sectional view of a capacitor according to a first embodiment.

FIG. 1 is a plan view and a cross-sectional view of a capacitor according to a first embodiment. An upper drawing of FIG. 1 is a plan view, and a lower drawing is a cross-sectional view taken along line A-A of the upper drawing. A direction normal to the upper surface of a substrate 10 is defined as a Z direction, and directions parallel to the upper surface of substrate 10 are defined as an X direction and a Y direction. As illustrated in FIG. 1, a semiconductor layer 11 is provided on substrate 10. Semiconductor layer 11 is, for example, a GaN-based semiconductor layer or a GaAs-based semiconductor layer. When semiconductor layer 11 is a GaN-based semiconductor layer, substrate 10 is, for example, an SiC substrate, a sapphire substrate, a silicon substrate, or a GaN substrate, and semiconductor layer 11 includes a layer made of GaN, AlN, InN, and a mixed crystal thereof. When semiconductor layer 11 is a GaAs-based semiconductor layer, substrate 10 is, for example, GaAs substrate, and semiconductor layer 11 includes a layer made of GaAs, AlAs, InAs, and a mixed crystal thereof. A transistor using semiconductor layer 11 may be provided on substrate 10, and a MIM capacitor 20 and the transistor may be integrated on the same substrate 10 to form an MMIC.

An insulating film 12 is provided on semiconductor layer 11. Insulating film 12 is an inorganic insulating film such as a silicon nitride film, a silicon oxide film, or a silicon nitride oxide film. The thickness of insulating film 12 is, for example, from 100 nm to 1200 nm. MIM capacitor 20 is provided on insulating film 12. MIM capacitor 20 includes a lower electrode 14 provided on insulating film 12, a dielectric film 16 provided on lower electrode 14, and an upper electrode 18 provided on dielectric film 16. In a parallel plate type MIM capacitor, the distance between lower electrode 14 and upper electrode 18 via dielectric film 16 is substantially uniform to the extent of a manufacturing error. An outer periphery 54 of lower electrode 14 is located outside an outer periphery 50 of upper electrode 18. Lower electrode 14 and upper electrode 18 are, for example, metal films including an adhesion film and a low-resistance film provided on the adhesion film. The adhesion film is, for example, a Ti film, a WSi film, a TiW film, a TiWN film, or a TiN film. The low-resistance film is made of a material having a resistivity lower than that of the adhesion film and is made of an Au film, for example. The thickness of the adhesion film is, for example, 3 nm to 300 nm. The adhesion film may be not provided. Thicknesses of the low-resistance films are, for example, 50 nm to 400 nm. Dielectric film 16 is an inorganic insulating film such as a silicon nitride film, a silicon oxide film, or a silicon nitride oxide film. The thickness of dielectric film 16 is, for example, 50 nm to 400 nm.

An insulating film 24 is provided on semiconductor layer 11 so as to cover MIM capacitor 20. Insulating film 24 is, for example, an organic insulator film such as a polyimide film. The thickness of insulating film 24 is, for example, 1 μm to 5 μm. An additional electrode 22 is provided in insulating film 24. Additional electrode 22 is provided above outer periphery 50 of upper electrode 18 via insulating film 24, and the outer periphery of upper electrode 18 overlaps additional electrode 22. That is, an outer periphery 52 of additional electrode 22 is located outside outer periphery 50 of upper electrode 18. Additional electrode 22 is electrically connected to upper electrode 18 via a connection portion 29. As a result, additional electrode 22 and upper electrode 18 have substantially the same potential. For example, additional electrode 22 includes an adhesion film such as a Ti film, a WSi film, a TiW film, a TiWN film, or a TiN film, and a low-resistance film such as an Au film provided on the adhesion film. The thickness of the adhesion film is, for example, 3 nm to 300 nm. The adhesion film may be not provided. The thickness of the low-resistance film is, for example, 100 nm to 1.5 μm.

In FIG. 1, D1 is the distance between outer periphery 52 of additional electrode 22 and outer periphery 50 of upper electrode 18, D2 is the distance between outer periphery 54 of lower electrode 14 and outer periphery 50 of upper electrode 18, D3 is the distance between the upper surface of lower electrode 14 and the lower surface of additional electrode 22, D4 is the distance between the upper surface of upper electrode 18 and the lower surface of additional electrode 22, D5 is the width of additional electrode 22, and D6 is the distance between the lower surface of additional electrode 22 and the lower surface of upper electrode 18. If the end faces of upper electrode 18, additional electrode 22 and lower electrode 14 are inclined or curved, outer peripheries 50, 52 and 54 are located on the outermost sides of the end faces.

When a current-carrying test is performed on MIM capacitor 20 without additional electrode 22, breakdown of the capacitor occurs mainly in the vicinity of the outer peripheral portion of upper electrode 18. Some capacitors have a short life. As a cause of breakdown in the capacitor having a short life, it is considered that fine peeling occurs between upper electrode 18 and insulating film 24 at outer periphery 50 of upper electrode 18. For example, when the upper surface of upper electrode 18 is made of Au film and insulating film 24 is made of an organic insulating film such as polyimide film, adhesion between upper electrode 18 and insulating film 24 is poor. Therefore, peeling is likely to occur at the interface between upper electrode 18 and insulating film 24. When dielectric film 16 is a hard insulating film such as an inorganic insulating film and insulating film 24 is a soft insulating film such as an organic insulating film, if stress is concentrated on outer periphery 50 of upper electrode 18, peeling is likely to occur at the interface between soft insulating film 24 and upper electrode 18. Since additional electrode 22 is provided in soft insulating film 24, stress is less likely to occur between additional electrode 22 and insulating film 24, and peeling is less likely to occur therebetween.

When a peeled portion between upper electrode 18 and insulating film 24 becomes a space, the capacitance of the space becomes smaller than the capacitance of insulating film 24 because the dielectric constant of the space is smaller than the dielectric constant of insulating film 24. Accordingly, the electric field is concentrated in the space. It is considered that when the concentration of the electric field becomes large, partial discharge occurs between upper electrode 18 and lower electrode 14, and the life of the capacitor becomes extremely short. Thus, in the first embodiment, additional electrode 22 is provided to prevent the electric field from being concentrated on the outer periphery of upper electrode 18.

(Simulation)

Figure 2A:
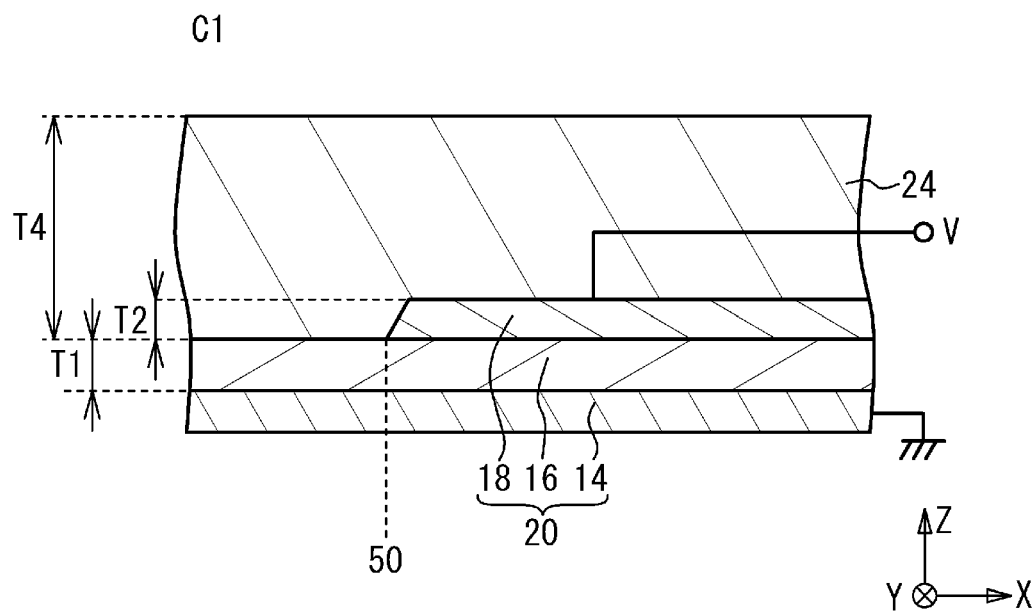
FIG. 2A is a cross-sectional view illustrating the structure of a capacitor C1.
Figure 2B:
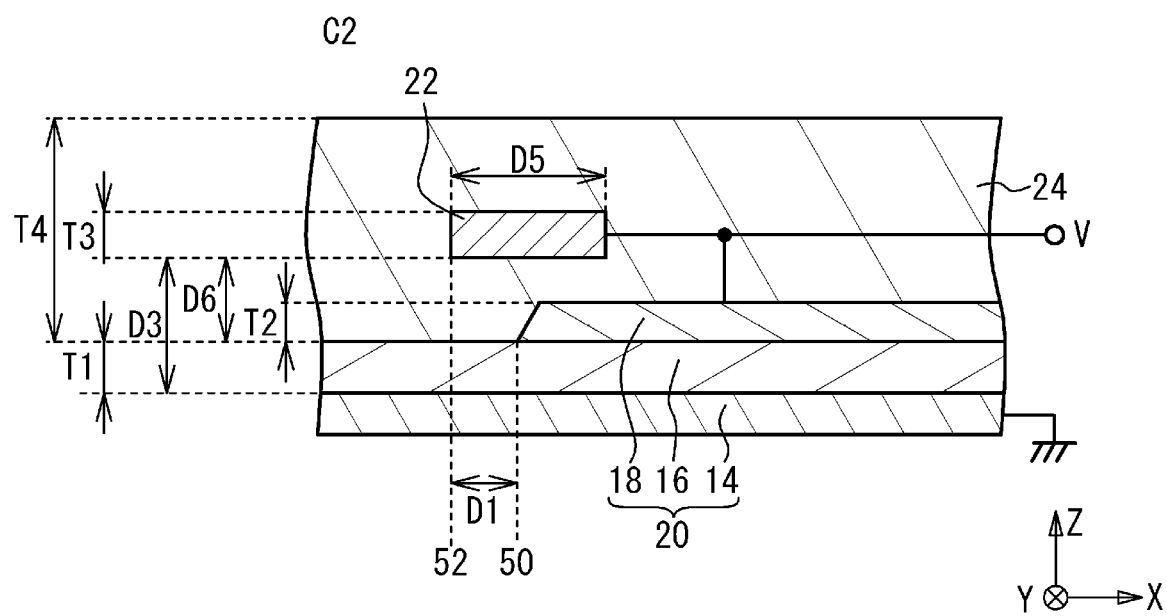
FIG. 2B is a cross-sectional view illustrating the structure of a capacitor C2.

With respect to a capacitor C1 in which additional electrode 22 is not provided and a capacitor C2 in which additional electrode 22 is provided, the magnitude of the electric field was simulated for a case B1 in which no space is formed between insulating film 24 and upper electrode 18 and for a case B2 in which a space is formed. FIGS. 2A and 2B are cross-sectional views illustrating the structures of capacitors C1 and C2, respectively. As illustrated in FIGS. 2A and 2B, in capacitors C1 and C2, dielectric film 16, upper electrode 18, and insulating film 24 are provided on lower electrode 14. Lower electrode 14, dielectric film 16, and insulating film 24 are provided sufficiently large in X direction so as not to affect the electric field around upper electrode 18 and additional electrode 22. In capacitor C2, additional electrode 22 is provided in insulating film 24. Lower electrode 14 is connected to ground, and a voltage V is applied to upper electrode 18 and additional electrode 22. The simulation uses a boundary condition that the potential at infinity in Z direction is 0V. Capacitor C1 corresponds to the comparative example, and capacitor C2 corresponds to the first embodiment.

The thicknesses of dielectric film 16, upper electrode 18, additional electrode 22 and insulating film 24 are T1, T2, T3 and T4, respectively. The simulation conditions are as follows.

Figure 3A:
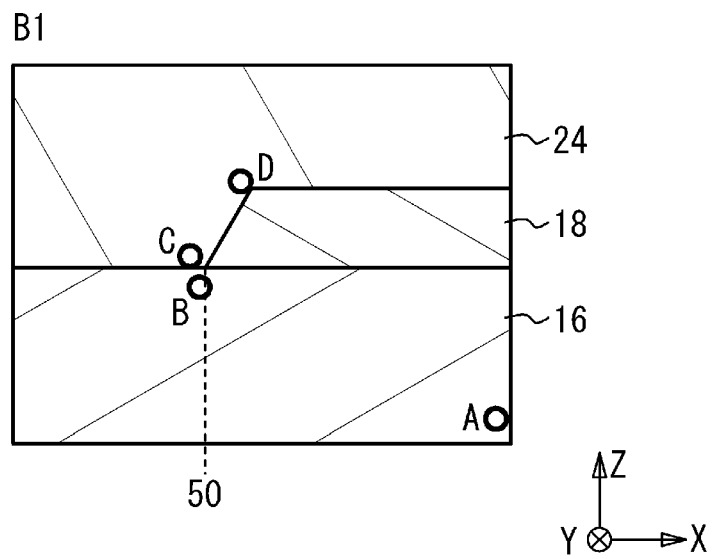
FIG. 3A is a cross-sectional view illustrating the structure of a case B1.
Figure 3B:
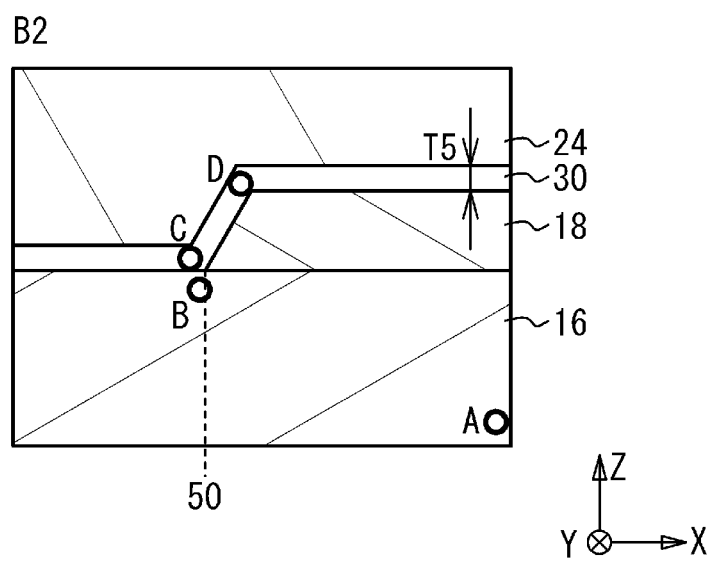
FIG. 3B is a cross-sectional view illustrating the structure of a case B2.

Lower electrode 14: perfect conductor
Dielectric film 16: silicon nitride film, T1=400 nm
Upper electrode 18: perfect conductor, T2=80 nm
Additional electrode 22: perfect conductor, T3=400 nm, D1=1000 nm, D5=2000 nm, D6=800 nm
Insulating film 24: polyimide, T4=2000 nm, D3=1200 nm FIGS. 3A and 3B are cross-sectional views illustrating structures in case B1 and case B2, respectively. FIGS. 3A and 3B are enlarged views of outer periphery 50 of upper electrode 18. Additional electrode 22 is located outside the figure. As illustrated in FIG. 3A, in case B1, dielectric film 16, upper electrode 18 and insulating film 24 are in contact with each other. As illustrated in FIG. 3B, in case B2, a space 30 is provided between dielectric film 16 and insulating film 24, and between upper electrode 18 and insulating film 24. A Thickness T5 of space 30 is 20 nm, and T5 is uniform. The electric fields at points A to D were simulated. Point A is a point in dielectric film 16 under upper electrode 18. Point B is a point in dielectric film 16 under outer periphery 50 of upper electrode 18. Point C is a point on the –X side of the lower end of upper electrode 18. Point D is a point on the –X side of the upper end of upper electrode 18. In case B1, points C and D are located inside insulating film 24, and in case B2, points C and D are located inside space 30. The electric field intensities at points B to D were normalized by the electric field intensity at point A.

TABLE 1 illustrates the normalized electric field strength at each point.

| CAPACITOR | CASE | A | B | C | D |
|---|---|---|---|---|---|
| C1 | B1 | 1 | 1.2 | 0.9 | 0.5 |
|  | B2 | 1 | 1.7 | 2.5 | 3.5 |

TABLE 1-continued illustrates the normalized electric field strength at each point.

| CAPACITOR | CASE | A | B | C | D |
|---|---|---|---|---|---|
| C2 | B1 | 1 | 1.2 | 0.9 | 0.5 |
|  | B2 | 1 | 1.6 | 2.0 | 2.0 |

As illustrated in Table 1, in capacitor C1 in which additional electrode 22 is not provided, the electric field intensities at points C and D in case B2 with film peeling are three times and seven times the electric field intensities at points C and D in case B1 without film peeling, respectively. When additional electrode 22 is not provided as described above, the electric field intensity in space 30 increases. In particular, the electric field intensity near the upper end of upper electrode 18 increases.

In capacitor C2 in which additional electrode 22 is provided, the electric field intensity in case B1 is the same as that of capacitor C1 at any of points A to D. The electric field intensity at points C and D in case B2 is lower than that of capacitor C1 in case B2. In particular, the electric field intensity at point D is substantially the same as that at point C. As described above, in capacitor C2 in which additional electrode 22 is provided, electric field concentration is suppressed even if space 30 is formed between insulating film 24 and upper electrode 18. As a result, breakdown in the energization test is suppressed. It is considered that the electric field concentration at point D is suppressed because outer periphery 52 of additional electrode 22 is located outside outer periphery 50 of upper electrode 18 and additional electrode 22 having the same potential as that of upper electrode 18 shields the electric field applied to upper electrode 18 from 0V at infinity.

According to the first embodiment, additional electrode 22 is provided above outer periphery 50 of upper electrode 18 in insulating film 24 and is electrically connected to upper electrode 18. Outer periphery 52 of additional electrode 22 is located outside outer periphery 50 of upper electrode 18. As a result, since additional electrode 22 shields the electric field, destruction of the capacitor in an energization test or the like is suppressed.

Although outer periphery 52 of additional electrode 22 may be located outside outer periphery 50 of upper electrode 18 in a part of the outer periphery of upper electrode 18, outer periphery 52 of additional electrode 22 may be located outside outer periphery 50 of upper electrode 18 along an entirety of the outer periphery of upper electrode 18. Thus, the breakdown of the capacitor can be suppressed.

In the case of shielding the electric field, if the angle between the straight line connecting outer periphery 50 of upper electrode 18 and outer periphery 52 of additional electrode 22 and the lower surface of upper electrode 18 is 45° or less, the shielding effect of the electric field is sufficiently obtained. In this respect, distance D1 between outer periphery 52 of additional electrode 22 and outer periphery 50 of upper electrode 18 may be greater than or equal to distance D6 between the lower surface of additional electrode 22 and the lower surface of upper electrode 18. That is, outer periphery 52 of additional electrode 22 may be located outside outer periphery 50 of upper electrode 18 by a distance greater than or equal to distance D6. Distance D1 may be greater than or equal to 1.5 times distance D6, and may be greater than or equal to twice distance D6. If distance D1 is too large, the capacitance between additional electrode 22 and lower electrode 14 cannot be ignored with respect to the capacitance of the main body of MIM capacitor 20. Therefore, distance D1 may be less than or equal to ten times distance D6.

If distance D4 between additional electrode 22 and upper electrode 18 is too large, the effect of shielding the electric field is reduced. Therefore, distance D4 may be less than or equal to ten times thickness T1 of dielectric film 16, and may be less than or equal to five times thickness T1.

Outer periphery 54 of lower electrode 14 is located outside outer periphery 50 of upper electrode 18. Thus, an electric field from substrate 10 side can be shielded. Therefore, the breakdown of the capacitor can be suppressed. Outer periphery 54 of lower electrode 14 may be located outside outer periphery 50 of upper electrode 18 in a part of outer periphery 50 of upper electrode 18, and outer periphery 54 of lower electrode 14 may be located outside outer periphery 50 of upper electrode 18 along an entirety of outer periphery 50 of upper electrode 18. Thus, the breakdown of the capacitor can be suppressed.

Distance D2 between outer periphery 54 of lower electrode 14 and outer periphery 50 of upper electrode 18 may be greater than or equal to a half of thickness T1 of dielectric film 16, may be greater than or equal to thickness T1, and may be greater than or equal to twice thickness T1. Thus, the electric field can be further shielded. If distance D2 is too large, the capacitance between additional electrode 22 and lower electrode 14 cannot be ignored with respect to the capacitance of the main body of MIM capacitor 20. Therefore, distance D2 may be less or equal to ten times thickness T1.

If distance D3 between additional electrode 22 and lower electrode 14 is too small, the capacitance between additional electrode 22 and lower electrode 14 cannot be ignored with respect to the capacitance of the main body of MIM capacitor 20. Therefore, distance D3 may be greater than or equal to twice thickness T1. That is, the lower surface of additional electrode 22 may be located above the upper surface of lower electrode 14 by a distance greater than or equal to twice thickness T1 of dielectric film 16. Distance D3 may be greater than or equal to three times thickness T1, and may be greater than or equal to four times thickness T1. In order to shield the electric field, distances D3 may be less than or equal to 10 times thickness T1.

When dielectric film 16 is an inorganic insulator film and insulating film 24 is an organic insulator film, insulating film 24 is likely to peel off from upper electrode 18 above outer periphery 50 of upper electrode 18 because insulating film 24 is softer than dielectric film 16. Therefore, additional electrode 22 may be provided.

MIM capacitor 20 is provided on or above semiconductor layer 11. Thus, an active element such as a transistor formed in semiconductor layer 11, and MIM capacitor 20 can be integrated on the same substrate 10.

Second Embodiment

Figure 4:
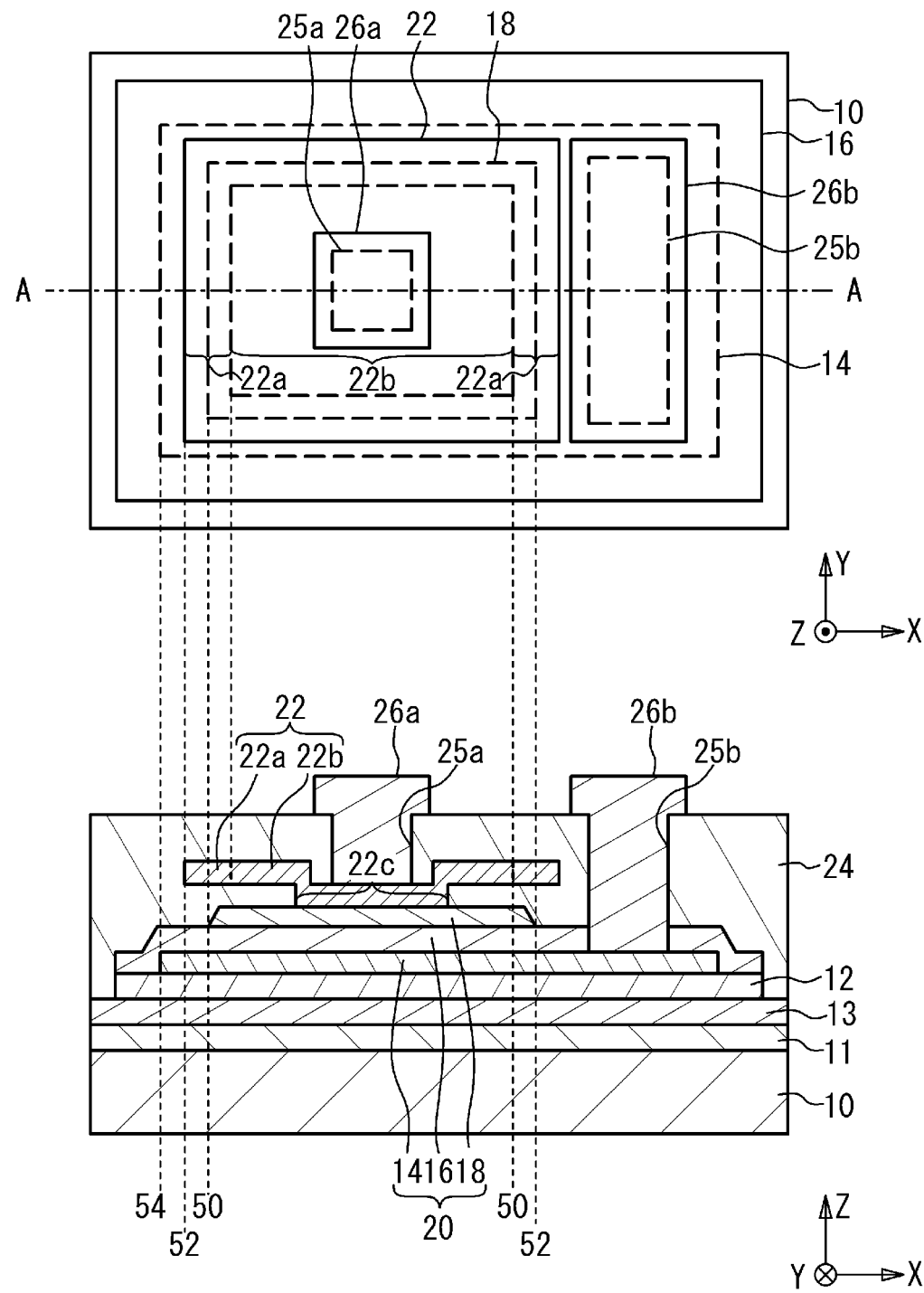
FIG. 4 is a plan view and a cross-sectional view of a capacitor according to a second embodiment.

FIG. 4 is a plan view and a cross-sectional view of a capacitor according to a second embodiment. The upper drawing of FIG. 4 is a plan view, and the lower drawing is a cross-sectional view taken along line A-A of the upper drawing. As illustrated in FIG. 4, an insulating film 13 is provided on semiconductor layer 11, and insulating film 12 is provided on insulating film 13. Additional electrode 22 includes an outer peripheral portion 22a and a connection portion 22b. Outer peripheral portion 22a is provided to overlap outer periphery 50 of upper electrode 18. Connection portion 22b connects outer peripheral portion 22a to upper electrode 18. A central portion 22c of connection portion 22b is in contact with upper electrode 18. As a result, outer peripheral portion 22a is electrically connected to upper electrode 18, and outer peripheral portion 22a and upper electrode 18 have substantially the same potential. A through-hole 25a penetrating insulating film 24 is provided, and a wiring 26a is electrically connected to upper electrode 18 via through-hole 25a. A through-hole 25b is provided through insulating film 24 and dielectric film 16, and a wiring 26b is electrically connected to lower electrode 14 via through-hole 25b. Wirings 26a and 26b electrically connect MIM capacitor 20 to other elements or pads, etc. Other configurations are the same as those of the first embodiment, and a description thereof will be omitted.

Substrate 10 is, for example, an SiC substrate. Semiconductor layer 11 includes, for example, a GaN channel layer and an AlGaN barrier layer. Insulating films 13 and 12 are, for example, a silicon nitride film and a silicon oxide film, respectively. Lower electrode 14 is, for example, a Ti film and an Au film on the Ti film. Dielectric film 16 is, for example, a silicon nitride film. Upper electrode 18 is, for example, a Ti film and an Au film on the Ti film. Additional electrode 22 is, for example, a Ti film and an Au film on the Ti film. Insulating film 24 is, for example, a polyimide film. Wirings 26a and 26b are, for example, a TiW film and an Au film on the TiW film.

Figure 5A:
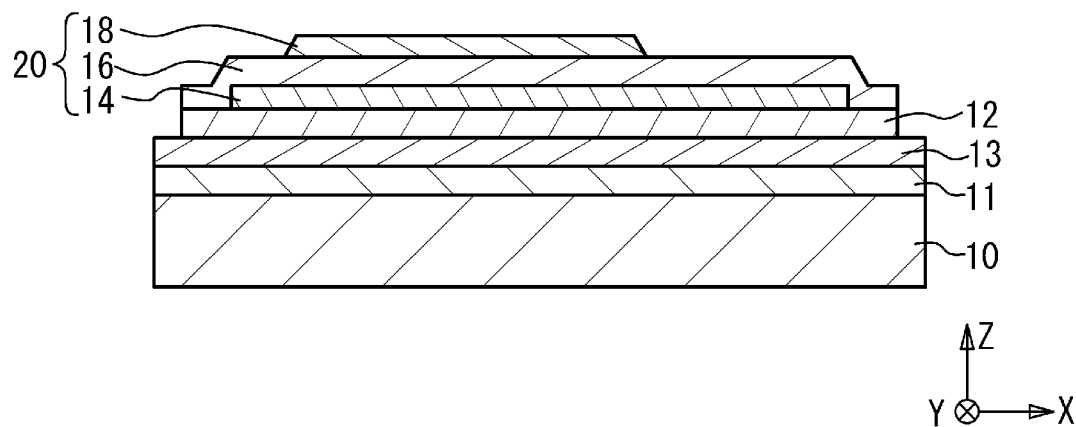
FIG. 5A is a cross-sectional view (No. 1) illustrating a method for manufacturing a capacitor according to the second embodiment.

FIGS. 5A to 6B are cross-sectional views illustrating a method for manufacturing a capacitor according to the second embodiment. As illustrated in FIG. 5A, insulating films 13 and 12 are formed on substrate 10 on which semiconductor layer 11 is formed. Insulating films 13 and 12 are formed by, for example, a CVD (Chemical Vapor Deposition) method. When insulating film 13 is a silicon nitride film, a plasma CVD method is used to form insulating film 13, and when insulating film 12 is a silicon oxide film, an atmospheric pressure CVD method is used to form insulating film 12. Lower electrode 14 is formed on insulating film 12. Lower electrode 14 is formed by, for example, a sputtering method and an etching method. Lower electrode 14 may be formed by a vacuum deposition method and a lift-off method. Dielectric film 16 is formed on insulating film 12 and on lower electrode 14 by, for example, CVD. When dielectric film 16 is a silicon nitride film, a plasma CVD method is used to form dielectric film 16. Upper electrode 18 is formed on dielectric film 16. Upper electrode 18 is formed by, for example, a vacuum deposition method and a lift-off method. A sputtering method and an etching method may be used to form upper electrode 18. Dielectric film 16 and insulating film 12 are patterned into a desired shape using an etching method.

Figure 5B:
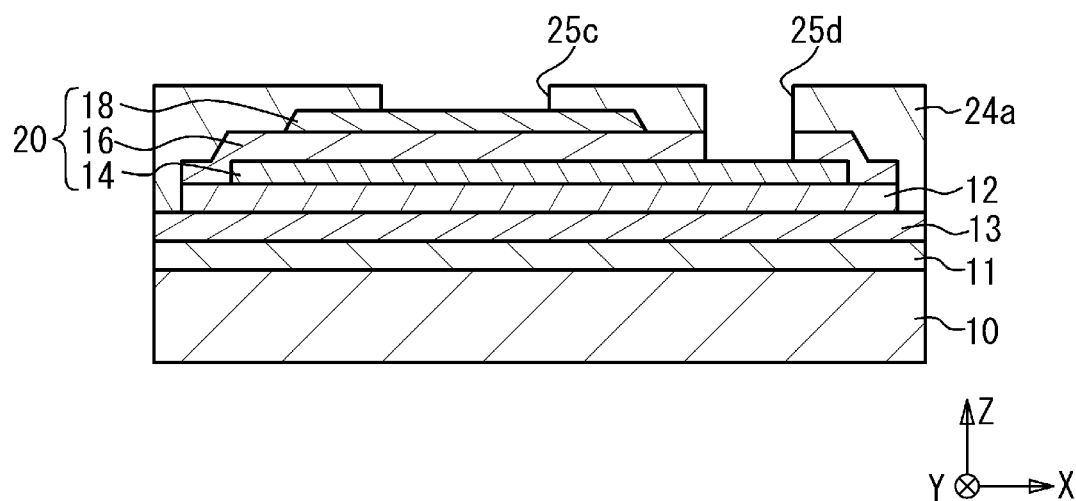
FIG. 5B is a cross-sectional view (No. 2) illustrating the method for manufacturing the capacitor according to the second embodiment.

As illustrated in FIG. 5B, an insulating film 24a is formed on substrate 10 to cover MIM capacitor 20. When insulating film 24a is an organic insulator such as polyimide, for example, a coating method is used to form insulating film 24a. For example, through-holes 25c and 25d are formed through insulating film 24a by using an etching method. Through-hole 25c is formed on upper electrode 18, and through-hole 25d is formed on lower electrode 14 outside MIM capacitor 20.

Figure 5C:
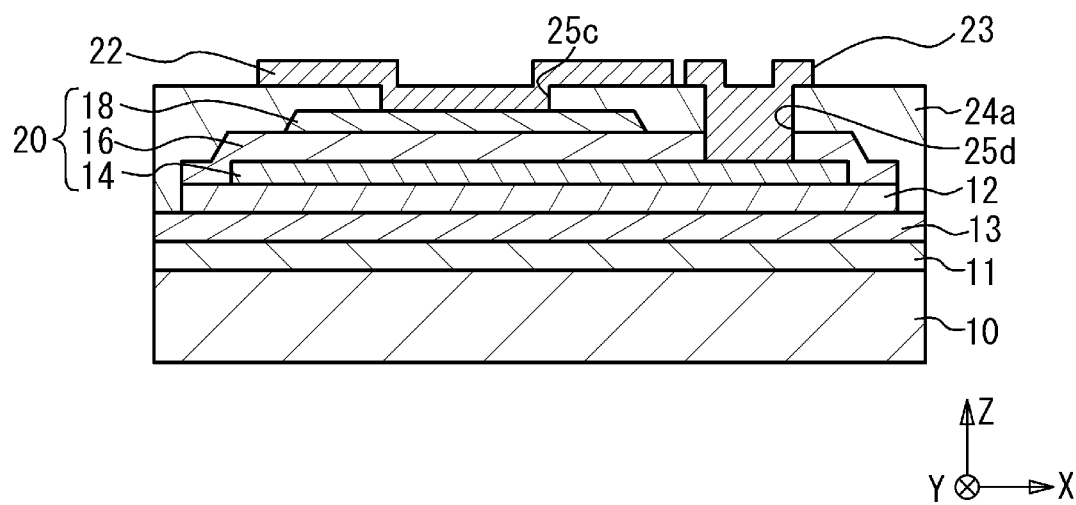
FIG. 5C is a cross-sectional view (No. 3) illustrating the method for manufacturing the capacitor according to the second embodiment.

As illustrated in FIG. 5C, additional electrode 22 and a wiring layer 23 are formed on insulating film 24a, and additional electrode 22 and wiring layer 23 are formed in through-holes 25c and 25d, respectively. Additional electrode 22 and wiring layer 23 are formed by, for example, a sputtering method and an etching method, a vacuum deposition method and a lift-off method, or a plating method. When additional electrode 22 is formed by the plating method, for example, a seed layer is formed by the sputtering method or the vacuum deposition method, and a mask layer is formed on the seed layer. A plating layer is formed on the seed layer using the mask layer as a mask. The seed layer is etched using the plating layer as a mask.

Figure 6A:
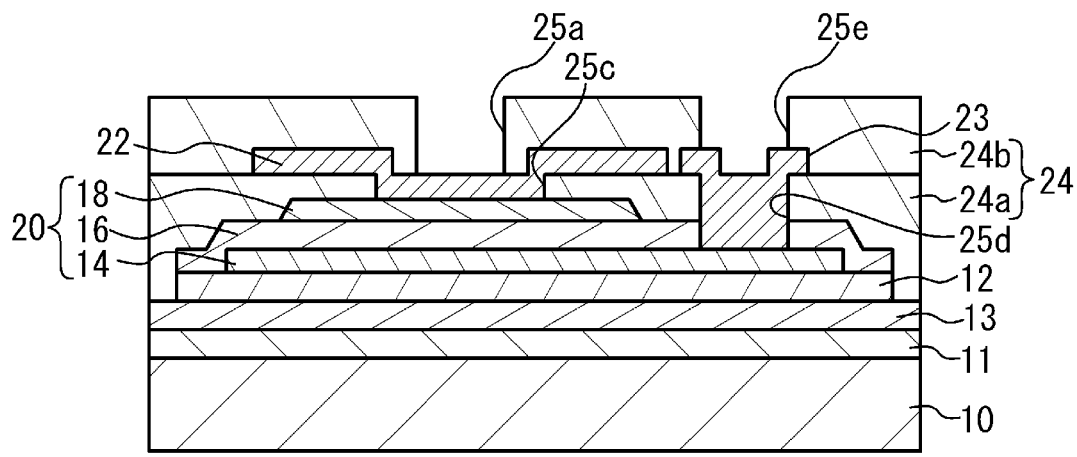
FIG. 6A is a cross-sectional view (No. 4) illustrating the method for manufacturing the capacitor according to the second embodiment.

As illustrated in FIG. 6A, an insulating film 24b is formed on insulating film 24a so as to cover additional electrode 22 and wiring layer 23. When insulating film 24b is an organic insulator such as polyimide, for example, a coating method is used to form insulating film 24b. For example, through-holes 25a and 25e are formed through insulating film 24b by using an etching method. Through-hole 25a is formed on additional electrode 22, and through-hole 25e is formed on wiring layer 23.

Figure 6B:
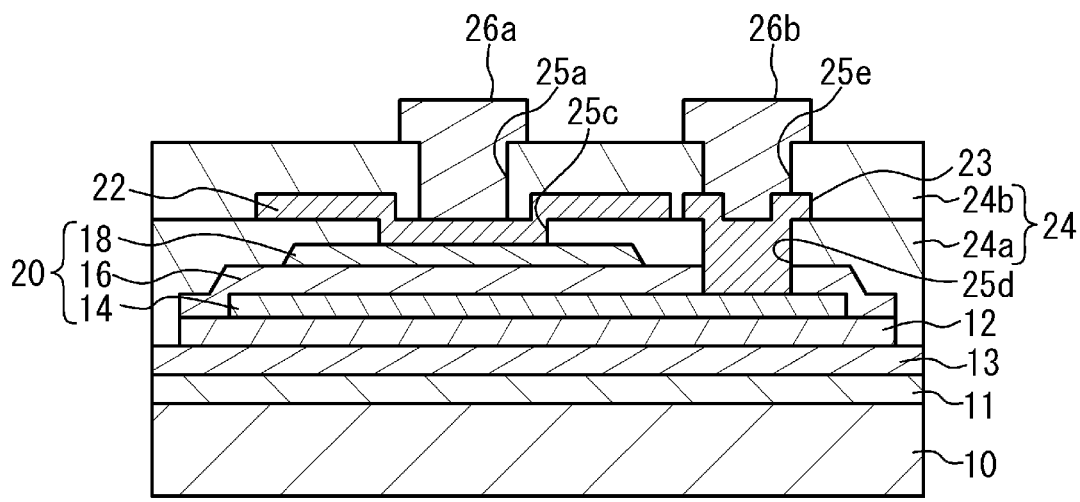
FIG. 6B is a cross-sectional view (No. 5) illustrating the method for manufacturing the capacitor according to the second embodiment.

As illustrated in FIG. 6B, wirings 26a and 26b are formed on insulating film 24b, and wirings 26a and 26b are formed in through-holes 25a and 25e, respectively. Wirings 26a and 26b are formed by the sputtering method, the vacuum deposition method, or the plating method, for example. For example, a seed layer may be formed using the sputtering method or the vacuum deposition method, and wirings 26a and 26b may be formed on the seed layer using the plating method. As illustrated in FIG. 4, wiring 26b may directly contact lower electrode 14, or as illustrated in FIG. 6B, wiring 26b may be connected to lower electrode 14 via wiring layer 23. As described above, the capacitor according to the second embodiment is manufactured.

In the second embodiment, additional electrode 22 is joined to upper electrode 18 at central portion 22c. Accordingly, outer peripheral portion 22a can be disposed above upper electrode 18 to shield electric field, and outer peripheral portion 22a and upper electrode 18 can be electrically connected by connection portion 22b.

Third Embodiment

Figure 7:
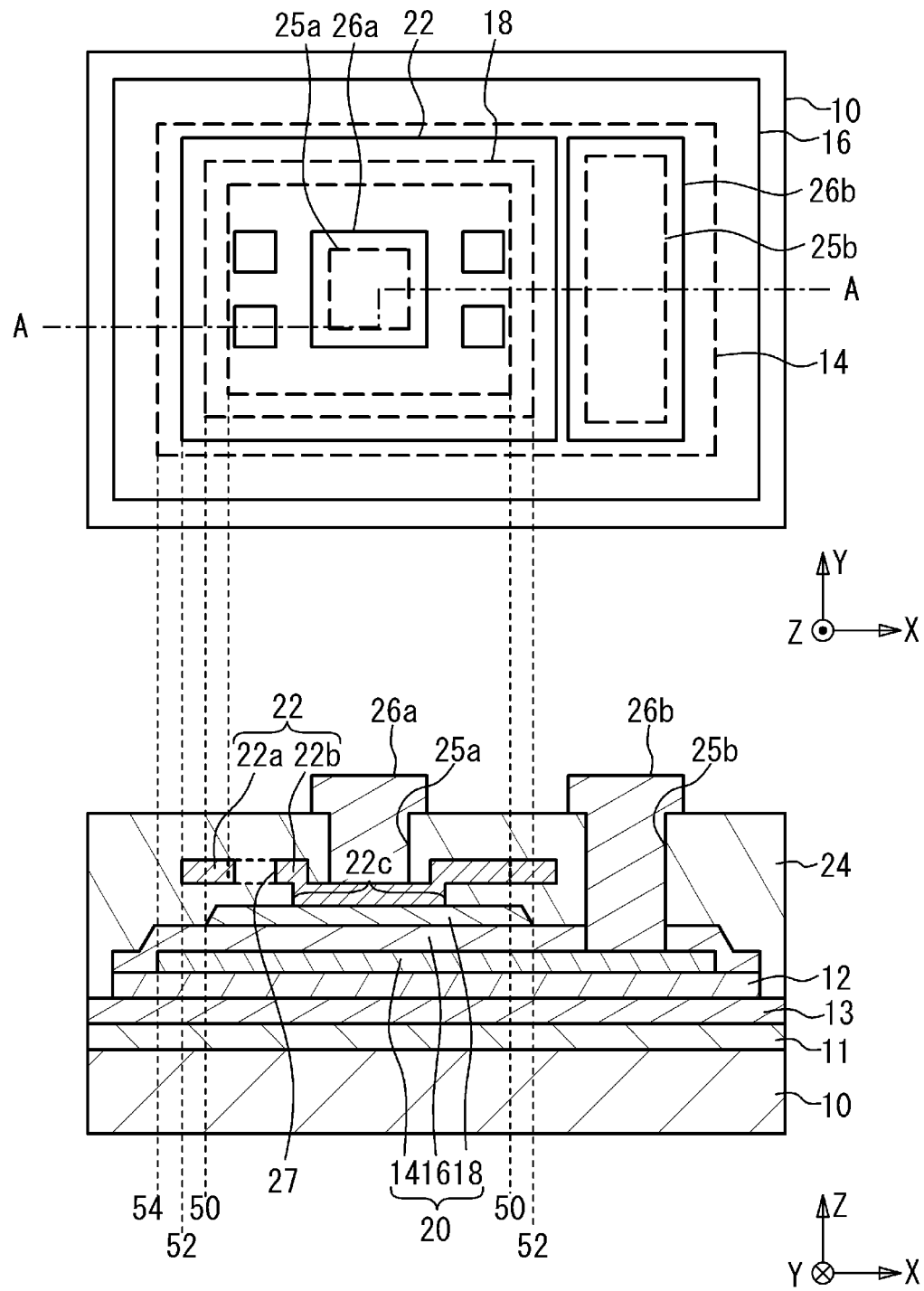
FIG. 7 is a plan view and a cross-sectional view of a capacitor according to a third embodiment.

FIG. 7 is a plan view and a cross-sectional view of a capacitor according to a third embodiment. The upper drawing of FIG. 7 is a plan view, and the lower drawing is a cross-sectional view taken along line A-A of the upper drawing. As illustrated in FIG. 7, an opening 27 is provided in connection portion 22b of additional electrode 22. Other configurations are the same as those of the second embodiment, and a description thereof will be omitted.

Figure 8A:
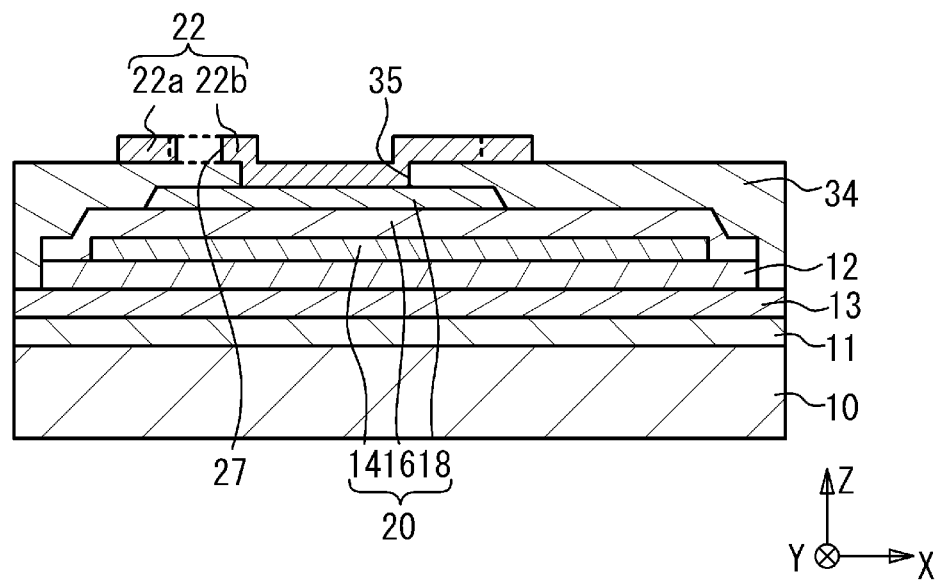
FIG. 8A is a cross-sectional view (No. 1) illustrating a method for manufacturing a capacitor according to a third embodiment.
Figure 8B:
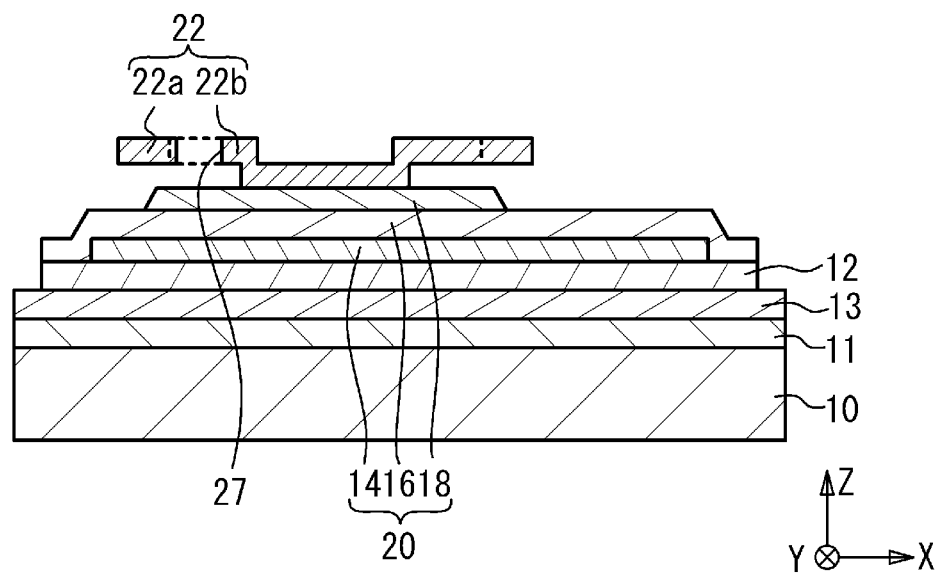
FIG. 8B is a cross-sectional view (No. 2) illustrating the method for manufacturing the capacitor according to the third embodiment.
Figure 8C:
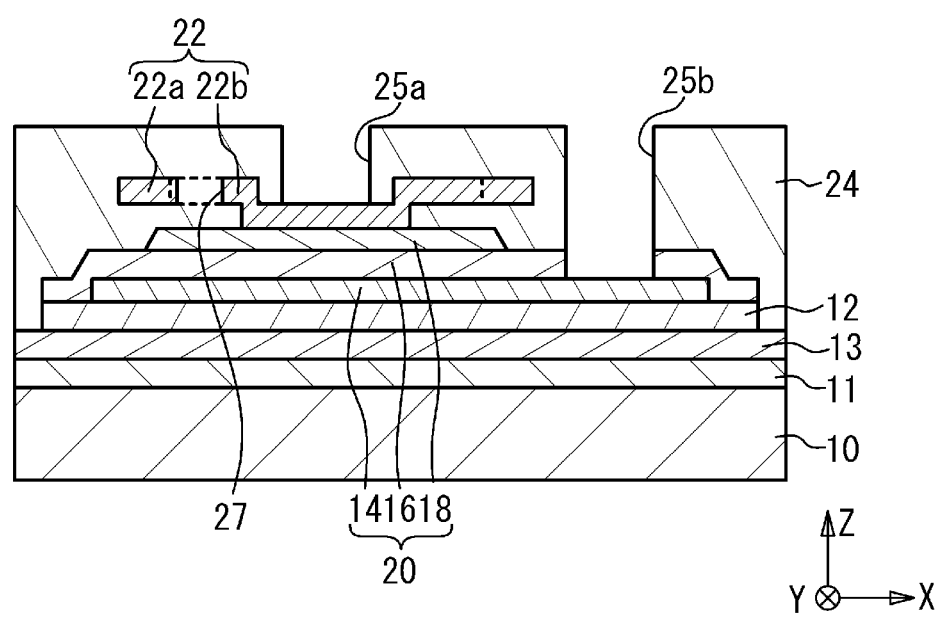
FIG. 8C is a cross-sectional view (No. 3) illustrating the method for manufacturing the capacitor according to the third embodiment.

FIGS. 8A to 8C are cross-sectional views illustrating a method for manufacturing a capacitor according to the third embodiment. As illustrated in FIG. 8A, after the step illustrated in FIG. 5A of the second embodiment, a mask layer 34 having an opening 35 is formed to cover MIM capacitor 20. Opening 35 is formed on upper electrode 18. Mask layer 34 is a photoresist, for example, and is formed by performing coating, exposure, and development. Additional electrode 22 having opening 27 is formed on mask layer 34. The method for forming additional electrode 22 is the same as that illustrated in FIG. 5C of the second embodiment.

As illustrated in FIG. 8B, mask layer 34 is removed. When mask layer 34 is a photoresist, for example, an organic solvent is used to remove mask layer 34. At this time, the organic solvent is supplied to mask layer 34 between additional electrode 22 and upper electrode 18 through opening 27. As a result, mask layer 34 can be removed without leaving mask layer 34 between additional electrode 22 and upper electrode 18.

As illustrated in FIG. 8C, insulating film 24 is formed so as to cover MIM capacitor 20 and additional electrode 22. When a solution containing an organic insulator is applied as insulating film 24, the solution containing the organic insulator is supplied between additional electrode 22 and upper electrode 18 through opening 27. As a result, insulating film 24 can be formed between additional electrode 22 and upper electrode 18. Opening 27 is filled with insulating film 24. Through-holes 25a and 25b are formed in insulating film 24. Thereafter, wirings 26a and 26b are formed in the same manner as in FIG. 6B of the second embodiment. Thus, the capacitor according to the third embodiment is manufactured.

According to the third embodiment, additional electrode 22 has opening 27 in a region facing the upper surface of upper electrode 18 across insulating film 24. Thus, mask layer 34 between additional electrode 22 and upper electrode 18 can be removed and insulating film 24 can be formed. Opening 27 may not overlap outer periphery 50 of upper electrode 18, and the distance between outer periphery 50 of upper electrode 18 and opening 27 may be greater than or equal to the distance between the lower surface of additional electrode 22 and the lower surface of upper electrode 18. This makes it possible to suppress the electric field from extending to outer periphery 50 of upper electrode 18 through opening 27.

(First Modification of Third Embodiment)

Figure 9:
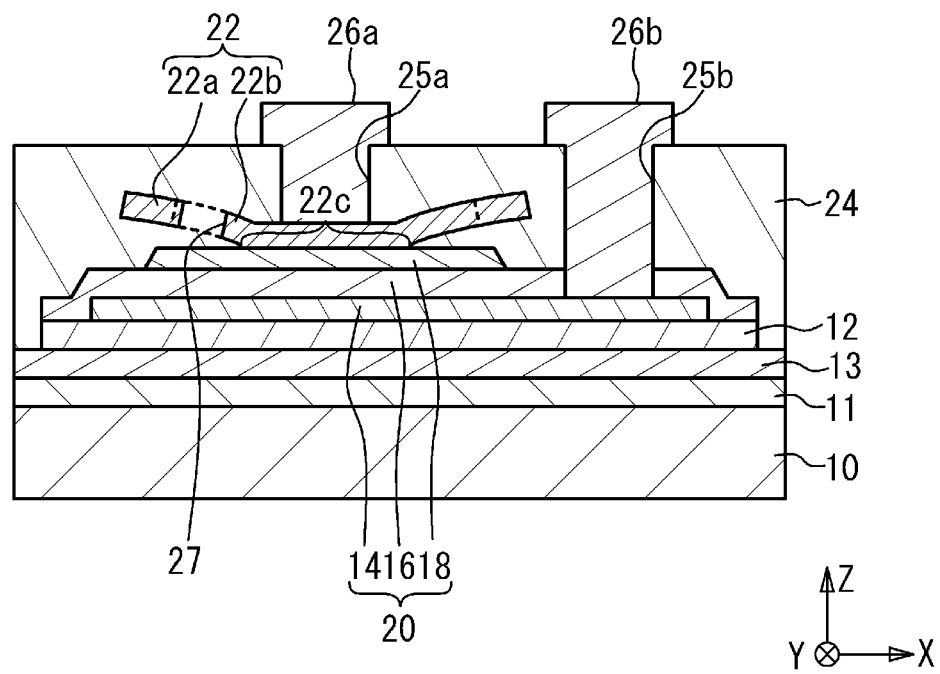
FIG. 9 is a cross-sectional view of a capacitor according to a first modification of the third embodiment.

FIG. 9 is a cross-sectional view of a capacitor according to a first modification of the third embodiment. As illustrated in FIG. 9, additional electrode 22 is curved such that the distance between the lower surface of additional electrode 22 and the upper surface of upper electrode 18 decreases toward central portion 22c. Other configurations are the same as those of the third embodiment, and a description thereof will be omitted. In the third embodiment, in FIG. 8A, since the side surface of opening 35 of mask layer 34 is vertical, the coverage of additional electrode 22 is poor, and additional electrode 22 may be thin in the vicinity of the side surface of opening 35. In the first modification of the third embodiment, the side surface of opening 35 is formed into a smooth curve, so that the thickness of additional electrode 22 can be made more uniform.

It should be understood that the embodiments disclosed herein are illustrative and non-restrictive in every respect. The scope of the present disclosure is defined not by the meaning described above but by the claims, and is intended to include all modifications within the meaning and scope equivalent to the claims.

What is claimed is:

1. A capacitor comprising:
   a metal-insulator-metal (MIM) capacitor that includes a lower electrode, a dielectric film disposed on the lower electrode, and an upper electrode disposed on the dielectric film;
   an insulating film that is disposed on the upper electrode so as to cover the MIM capacitor; and
   an additional electrode that is disposed in the insulating film and buried inside the insulating film and above an outer periphery of the upper electrode, has an outer periphery located outside the outer periphery of the upper electrode, and is connected to the upper electrode,
   wherein:
   the dielectric film surrounds a top surface of the lower electrode and side surface of the lower electrode,
   a lower surface of the upper electrode contacts with the dielectric film,
   a side surface of the upper electrode is surrounded by the insulating film, a lower surface, a side surface and an upper surface of the additional electrode are apart from the upper electrode and surrounded by the insulating film, and the insulating film is softer than the dielectric film.

2. The capacitor according to claim 1, wherein along an entirety of the outer periphery of the upper electrode, the outer periphery of the additional electrode is located outside the outer periphery of the upper electrode.

3. The capacitor according to claim 1, wherein the outer periphery of the additional electrode is located outside the outer periphery of the upper electrode by a distance greater than or equal to a distance between a lower surface of the additional electrode and a lower surface of the upper electrode.

4. The capacitor according to claim 1, wherein an outer periphery of the lower electrode is located outside the outer periphery of the upper electrode.

5. The capacitor according to claim 4, wherein a lower surface of the additional electrode is located above an upper surface of the lower electrode by a distance greater than or equal to twice a thickness of the dielectric film.

6. The capacitor according to claim 1, wherein the dielectric film is an inorganic insulator film, and the insulating film is an organic insulator film.

7. The capacitor according to claim 1, wherein the additional electrode is joined to the upper electrode at a central portion thereof.

8. The capacitor according to claim 1, wherein the additional electrode has an opening in a region facing an upper surface of the upper electrode across the insulating film.

9. The capacitor according to claim 1, wherein the MIM capacitor is disposed on or above a semiconductor layer.

* * * * *